(12) United States Patent
Yang

(10) Patent No.: US 11,049,848 B1
(45) Date of Patent: Jun. 29, 2021

(54) SEMICONDUCTOR DEVICE

(71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/880,929

(22) Filed: May 21, 2020

(51) Int. Cl.
*H04B 1/40* (2015.01)
*H01L 25/065* (2006.01)

(52) U.S. Cl.
CPC .......... *H01L 25/0657* (2013.01); *H04B 1/40* (2013.01); *H01L 2225/06506* (2013.01); *H01L 2225/06562* (2013.01)

(58) Field of Classification Search
CPC ....... H01L 25/0657; H01L 2225/06506; H01L 2225/06562; H04B 1/40
See application file for complete search history.

(56) References Cited

U.S. PATENT DOCUMENTS

| | | | |
|---|---|---|---|
| 7,973,310 B2 | 7/2011 | Wang et al. | |
| 8,847,615 B2 | 9/2014 | Lin et al. | |
| 2009/0189298 A1 | 7/2009 | Wu et al. | |
| 2009/0284161 A1* | 11/2009 | Kumar | H05B 45/44 315/209 R |
| 2014/0332983 A1* | 11/2014 | Ho | H01L 23/3121 257/777 |
| 2016/0225889 A1* | 8/2016 | Umeno | H01L 29/2003 |
| 2019/0139784 A1* | 5/2019 | Lin | H01L 23/49811 |

* cited by examiner

*Primary Examiner* — Timor Karimy
(74) *Attorney, Agent, or Firm* — CKC & Partners Co., LLC

(57) ABSTRACT

A semiconductor device includes a substrate and a chip. The chip stacked on the substrate includes an active surface and at least one metal pad. The metal pad is disposed on the active surface and comprises a first pad portion and a second pad portion separated from the first pad portion to form an open circuit. The first pad portion includes a protrusion structure and the second pad portion includes a recess structure. Moreover, the protrusion structure of the first pad portion extends toward the recess structure of the second pad portion.

15 Claims, 8 Drawing Sheets

SEMICONDUCTOR DEVICE

BACKGROUND

Field of Invention

The present disclosure relates to a semiconductor device, and more particularly, the semiconductor device is used in 3D package application.

Description of Related Art

One type of conventional semiconductor package, sometimes called a "stack-type" semiconductor package, is manufactured in such a manner that a fully-assembled individual top semiconductor package is stacked on a fully-assembled individual semiconductor bottom semiconductor package. The top and bottom semiconductor packages are electrically and mechanically coupled together at the interface between them. The stack-type semiconductor package subsequently is mounted on an external printed circuit board by electrically coupling interconnects of the bottom semiconductor package, e.g., solder balls, to circuit patterns of the printed circuit board. Hence, this stack-type package has the desirable feature of allowing two semiconductor packages to be mounted in the same printed circuit board area as a single semiconductor package.

A better, more robust stack-type semiconductor package that may be assembled more easily and at lower cost is therefore desirable.

SUMMARY

An aspect of the present disclosure is to provide a semiconductor device having at least one chip which can be easily stacked.

According to an embodiment of the present disclosure, a semiconductor device includes a substrate and a chip. The chip stacked on the substrate includes an active surface and at least one metal pad. The metal pad is located on the active surface and includes a first pad portion and a second pad portion separated from the first pad portion to form an open circuit. The first pad portion includes a protrusion structure and the second pad portion includes a recess structure. Moreover, the protrusion structure of the first pad portion extends toward the recess structure of the second pad portion.

In an embodiment of the present disclosure, the recess structure of the second pad portion surrounds the protrusion structure of the corresponding first pad portion.

In an embodiment of the present disclosure, the semiconductor device further includes at least one metal ball in contact with the first pad portion and the second pad portion to form a closed circuit.

In an embodiment of the present disclosure, the metal ball is at least in contact with the protrusion structure of the first metal pad and the recess structure of the second pad portion.

In an embodiment of the present disclosure, the at least one metal pad of the chip includes a first metal pad and a second metal pad, and the first pad portion of the first metal pad contacts the first pad portion of the second metal pad.

In an embodiment of the present disclosure, the at least one metal pad of the chip includes a first metal pad and a second metal pad, and the second pad portion of the first metal pad contacts the second pad portion of the second metal pad.

In an embodiment of the present disclosure, the at least one metal pad of the chip includes a first metal pad and a second metal pad, and the first pad portion of the first metal pad contacts the second pad portion of the second metal pad.

In an embodiment of the present disclosure, the at least one metal pad of the chip includes a first metal pad, and the semiconductor device further includes a first transceiver and a second transceiver. The first transceiver includes an output terminal electrically connected to the first pad portion of the first metal pad. The second transceiver includes an input terminal electrically connected to of the second pad portion of the first metal pad.

In an embodiment of the present disclosure, the at least one metal pad of the chip includes a second metal pad, and the second pad portion of the first metal pad contacts the first pad portion or the second pad portion of the second metal pad.

In an embodiment of the present disclosure, the at least one metal pad includes an input metal pad, and the first pad portion or the second pad portion of the input metal pad is electrically connected to an input terminal of the first transceiver.

Another aspect of the present disclosure is to provide a semiconductor device includes a substrate, a master chip, and at least one slave chip. The master chip is mounted on the substrate, and the master chip includes an active surface and at least one metal pad located on the active surface. The at least one slave chip which is stacked on the active surface of the master chip includes a first active surface and at least one bonding pad. The at least one bonding pad which is located on the first active surface includes a first bonding pad portion and a second bonding pad portion separated from the first bonding pad portion to form an open circuit in which the first bonding pad portion includes a protrusion structure and the second bonding pad portion includes a recess structure, and the protrusion structure of the first bonding pad portion extends toward the recess structure of the corresponding second bonding pad portion.

In an embodiment of the present disclosure, the recess structure of the second bonding pad portion surrounds the protrusion structure of the corresponding first bonding pad portion.

In an embodiment of the present disclosure, the semiconductor device further includes at least one conductive ball in contact with first bonding pad portion and the second bonding pad portion to form a closed circuit, and the conductive ball is electrically connected to the metal pad of the master chip through a conductive wire.

In an embodiment of the present disclosure, the conductive ball is in contact with the protrusion structure of the first bonding pad and the recess structure of the second bonding pad portion.

In an embodiment of the present disclosure, the at least one bonding pad of the slave chip includes a first bonding pad and a second bonding pad, and the first bonding pad portion of the first bonding pad contacts the first bonding pad portion of the second bonding pad.

In an embodiment of the present disclosure, the second bonding pad portion of the first bonding pad contacts the second bonding pad portion of the second bonding pad.

In an embodiment of the present disclosure, the first bonding pad portion of the first bonding pad contacts the second bonding pad portion of the second bonding pad.

In an embodiment of the present disclosure, the at least one bonding pad includes a first bonding pad, and the slave chip further includes a first transceiver and a second transceiver. The first transceiver includes an output terminal electrically connected to the first bonding pad portion of the first bonding pad. The second transceiver includes an input terminal electrically connected to the second bonding pad portion of the first bonding pad.

In an embodiment of the present disclosure, the at least one metal pad includes an input bonding pad in which the first bonding pad portion or the second bonding pad portion of the input bonding pad is electrically connected to an input terminal of the first transceiver.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
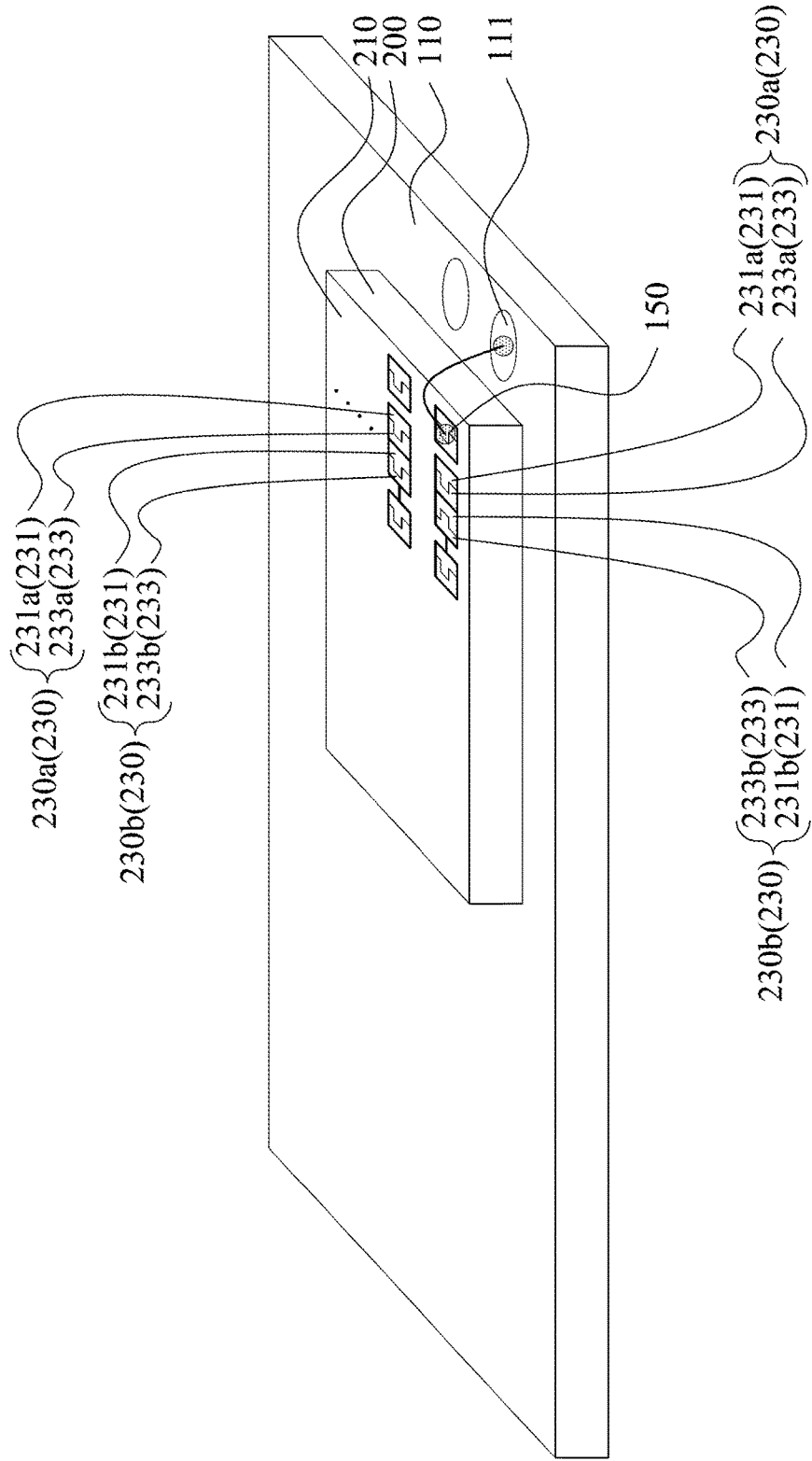
FIG. 1 is a schematic diagram of a semiconductor device regarding some embodiments in the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment", "some embodiments" or the like means that a particular feature, structure, configuration, or characteristic described in connection with the embodiment is included in at least one embodiment of the disclosure. Thus, the appearances of the phrase "in one embodiment," "in an embodiment", "in some embodiments" or the like in various places throughout this specification are not necessarily referring to the same embodiment of the disclosure. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Figure 2:
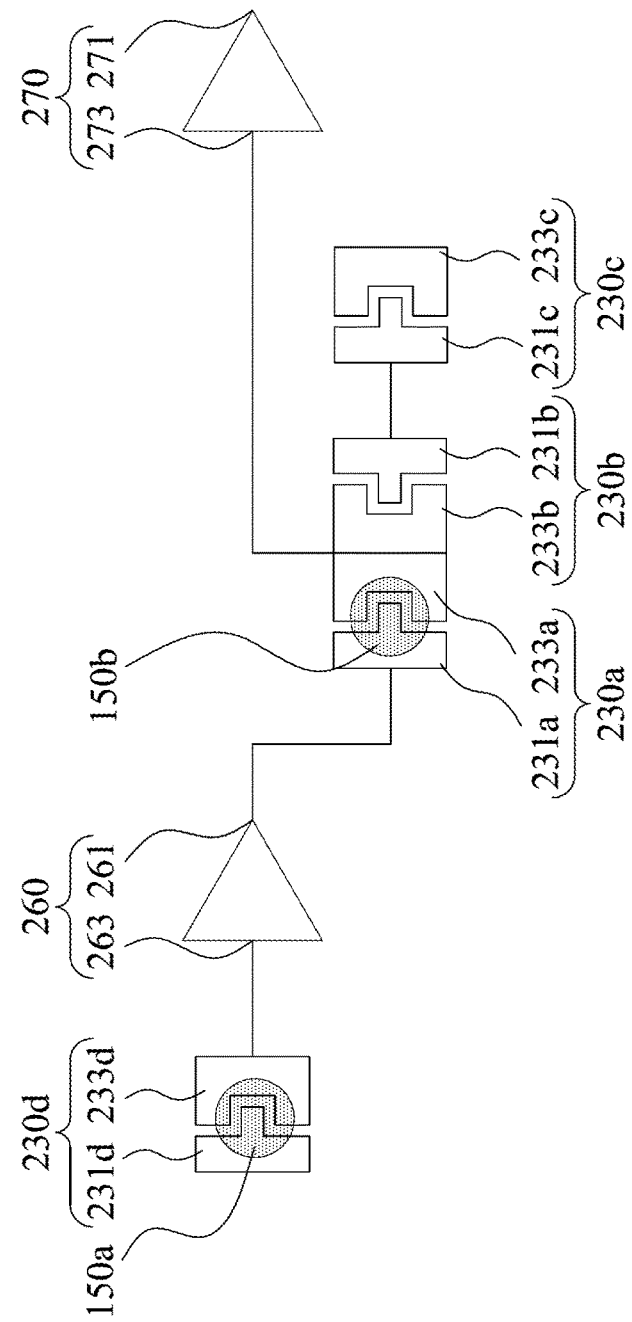
FIG. 2 is a schematic circuit diagram of a chip of the semiconductor device in the FIG. 1.

Reference is made to FIG. 1 and FIG. 2. FIG. 1 is a schematic diagram of a semiconductor device according some embodiments in the present disclosure. FIG. 2 is a schematic circuit diagram of a chip of the semiconductor device in the FIG. 1, but FIG. 2 does not specifically represent electrical connection relation of the semiconductor device in FIG. 1. Referring to FIG. 1, in some embodiments of the present disclosure, a semiconductor device 100 includes a substrate 110 and a chip 200. The chip 200 is stacked on the substrate 110, and the chip 200 includes an active surface 210 and at least one metal pad 230. When semiconductor device 100 includes two or more than two metal pads 230, the metal pads 230 can be electrically connected to each other or not. Specifically, the metal pad 230 is located on the active surface 210 and the metal pad 230 includes a first pad portion 231 and a second pad portion 233 which is separated from the first pad portion 231 to form an open circuit. Selectively forming an a closed circuit between metal pads 230 can be performed by selectively forming conductive material between the first pad portion 231 and the second pad portion 233.

The first pad portion 231 includes a protrusion structure and the second pad portion 233 includes a recess structure. Moreover, the protrusion structure of the first pad portion 231 extends toward the recess structure of the second pad portion 233. The recess structure of the second pad portion 233 surrounds the protrusion structure of the corresponding first pad portion 231. The protrusion structure of the first pad portion 231 can be in a triangle shape, a rectangle shape, or a round shape, and the recess structure of the second pad portion 233 can be in a shape corresponding to the protrusion structure, but the present disclosure in not limited in this respect. While a conductive material is formed to contact the first pad portion 231 and the second pad portion 233, the protrusion structure and recess structure thereof can form a burdening platform and provide additional surface area to fix the conductive material.

In some embodiments of the present disclosure, the semiconductor device 100 further includes a metal ball 150 in contact with the first pad portion 231 and the second pad portion 233 to form a closed circuit. The metal ball 150 is electrically connected to a contacting pad 111 on the substrate 110 through a conductive wire. The metal ball 150 is at least in contact with the protrusion structure of the first pad portion 231 and the recess structure of the second pad portion 233, and the metal ball 150 is stubbornly fixed on the metal pad 230 with larger contacting surface area.

The chip 200 includes a first metal pad 230a and a second metal pad 230b, and the second pad portion 233a of the first metal pad 230a contacts the second pad portion 233b of the second metal pad 230b to form a two-way switch. In other embodiments of the present disclosure, the first pad portion 231a of the first metal pad 230a can contact the first pad portion 231b of the second metal pad 230b, but the present disclosure is not limited in this respect. The first pad portion 231a of the first metal pad 230a contacts the second pad portion 233b of the second metal pad 230b according to other embodiments of the present disclosure. The second pad portion 233a of the first metal pad 230a contacts the first pad portion 231b of the second metal pad 230b in accordance with some embodiments of the present disclosure.

Reference is made to FIG. 2. In some embodiments of the present disclosure, the semiconductor device 100 further includes a first transceiver 260 and a second transceiver 270. The first transceiver 260 includes an output terminal 261 and an input terminal 263 in which the output terminal 261 is electrically connected to the first pad portion 231a of the first metal pad 230a. The second transceiver 270 includes and output terminal 271 and an input terminal 273, and the input terminal 273 is electrically connected to of the second pad portion 233a of the first metal pad 230a. Therefore, a switch between the first transceiver 260 and the second transceiver 270 is formed. In this embodiment of the present disclosure, the second pad portion 233a of the first metal pad 230a contacts the second pad portion 233b of the second metal pad 230b to form a two-way switch which can selectively form an open circuit or a closed circuit by putting the metal ball 150 on the first metal pad 230a or the second metal pad 230b.

Furthermore, the chip 200 also includes a third metal pad 230c. When the second pad portion 233a of the first metal pad 230a contacts the second pad portion 233b of the second metal pad 230b, the first pad portion 231b of the second metal pad 230b is electrically connected to the first pad portion 231c or the second pad portion 233c of the third metal pad 230c to form a two-way switch. When the second pad portion 233a of the first metal pad 230a contacts the first pad portion 231b of the second metal pad 230b, the second pad portion 233b of the second metal pad 230b is electrically connected to the first pad portion 231c or the second pad portion 233c of the third metal pad 230c to form a two-way switch, but the present disclosure is not limited in this respect. In this case, the aforementioned two-way switch can decide if a closed circuit is formed between the third metal pad 230c and the first transceiver 260, and the two-way switch is among the first transceiver 260, the second transceiver 270, and the third metal pad 230c.

The chip 200 further includes an input metal pad 230d. A first pad portion 231d or a second pad portion 233d of the input metal pad 230d is electrically connected to an input terminal 263 of the first transceiver 260. If a conductive material such as a metal ball 150a is formed between the first pad portion 231d and the second pad portion 233d, the signal can be transmitted to the first transceiver 260. Therefore, a signal path in the chip 200 can be decided by selectively forming the metal ball 150a.

In an embodiment of the present disclosure, the metal ball 150a simultaneously contacts the first pad portion 231d and the second pad portion 233d of the input metal pad 230d, and another metal ball 150b simultaneously contacts the first pad portion 231a and the second pad portion 233a of the first metal pad 230a to form a closed circuit. In this case, a signal can be transmitted from the input metal pad 230d to the second transceiver 270 passing through the first transceiver 260 and the first metal pad 230a.

Figure 3:
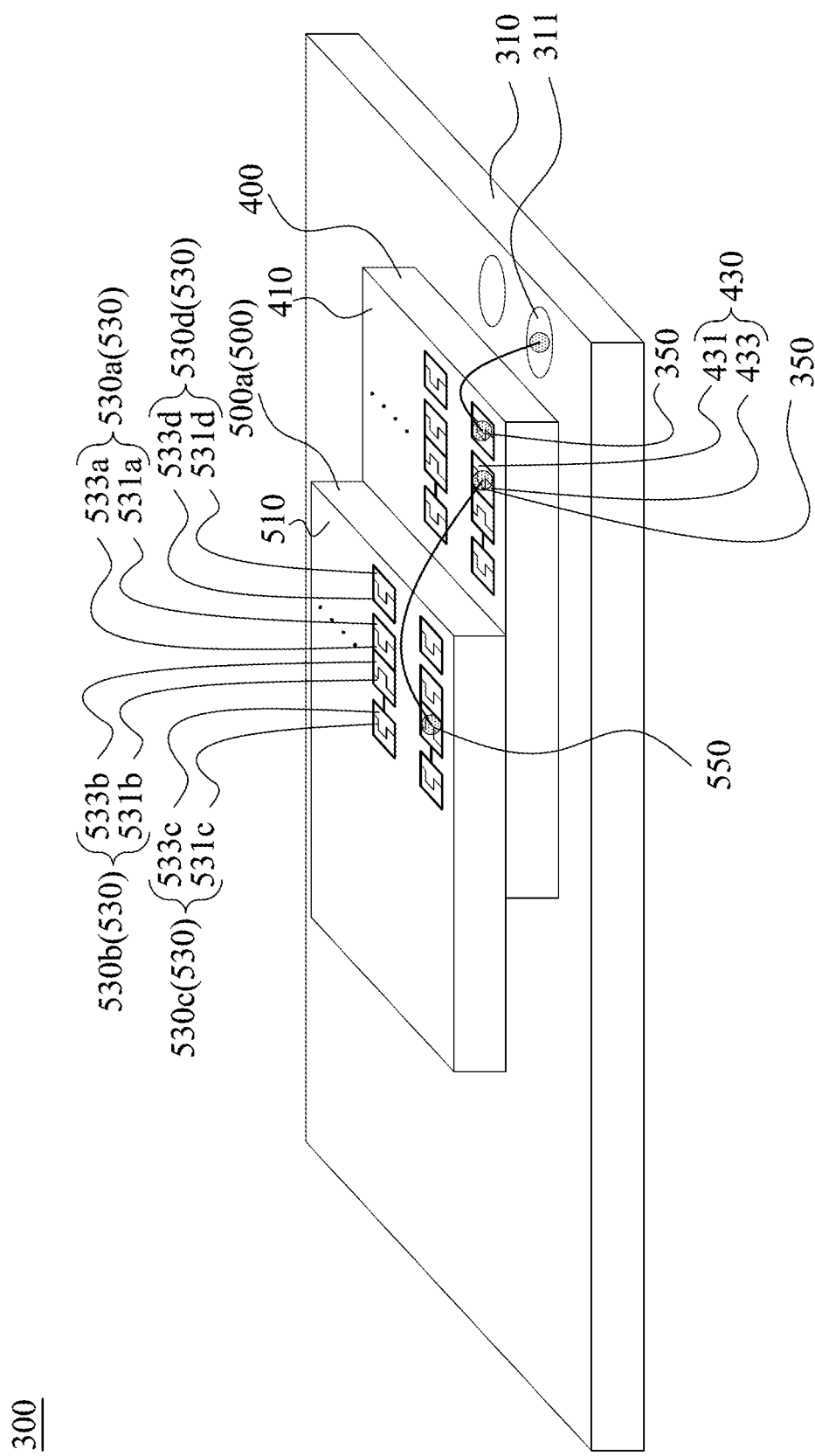
FIG. 3 is a schematic diagram of a semiconductor device according some embodiments in the present disclosure.
Figure 4:
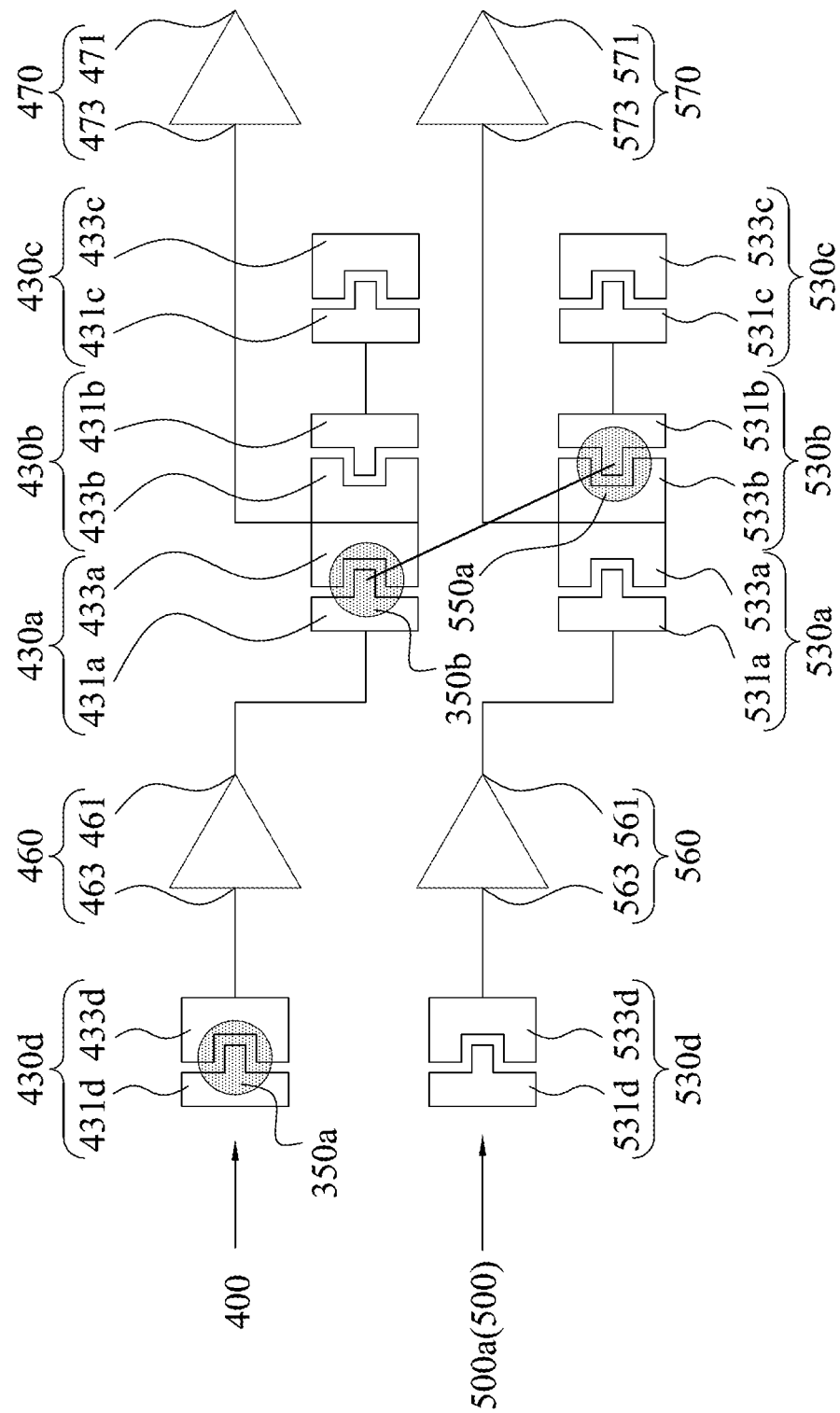
FIG. 4 is a schematic circuit diagram of a master chip and a slave chip of the semiconductor device in the FIG. 3.

Reference is made to FIG. 3 and FIG. 4. FIG. 3 is a schematic diagram of a semiconductor device according some embodiments in the present disclosure. FIG. 4 is a schematic circuit diagram of a master chip and a slave chip of the semiconductor device in the FIG. 3, but FIG. 4 does not specifically represent electrical connection relation of the semiconductor device in FIG. 3. In some embodiments of the present disclosure, a semiconductor device 300 includes a substrate 310, a master chip 400, and at least one slave chip 500. The master chip 400 is substantially the same as the chip 200. At least one metal pad 430 on an active surface 410 of the master chip 400 includes a first pad portion 431 and a second pad portion 433. The second pad portion 433 can be separated from the first pad portion 431 to form an open circuit between the first pad portion 431 and the second pad portion 433, but the present disclosure is not limited in this respect. In other embodiments of the present disclosure, the metal pad 430 is formed integratedly. A metal ball 350 can be put on the metal pad 430 to simultaneously contact the first pad portion 431 and the second pad portion 433 to form a closed circuit between the first pad portion 431 and the second pad portion 433. The master chip 400 is mounted on the substrate 310, and the master chip 400 includes an active surface 410 and at least one metal pad 430 located on the active surface 410. The metal pad 430 can be electrically connected to a metal pad 311 of the substrate 310 through a conductive wire. The master chip 400 may include four metal pads 430, such as a first metal pad 430a, a second metal pad 430b, a third metal pad 430c, and an input metal pad 430d. The slave chip 500 is stacked on the active surface 410 of the master chip 400, and the slave chip 500 includes a first active surface 510 and at least one bonding pad 530 located on the first active surface 510. When the number of the bonding pad 530 is more than two, the bonding pads 530 can be electrically connected to each other. The slave chip 500 includes a first bonding pad portion 531 and a second bonding pad portion 533 which is separated from the first bonding pad portion 531 to form an open circuit between the first bonding pad portion 531 and the second bonding pad portion 533. The first bonding pad portion 531 includes a protrusion structure and the second bonding pad portion 533 includes a recess structure, and the protrusion structure of the first bonding pad portion 531 extends toward the recess structure of the corresponding second bonding pad portion 533. Moreover, the recess structure of the second bonding pad portion 533 surrounds the protrusion structure of the corresponding first bonding pad portion 531. The protrusion structure of the first bonding pad portion 531 can be in a triangle shape, a rectangle shape, or a round shape, and the recess structure of the second bonding pad portion 533 can be in a shape corresponding to the protrusion structure, but the present disclosure in not limited in this respect.

Reference is made to FIG. 3. The semiconductor device 300 further includes at least one conductive ball 550 simultaneously in contact with first bonding pad portion 531 and the second bonding pad portion 533 of the bonding pad 530 to form a closed circuit, and the conductive ball 550 can be electrically connected to the metal pad 430 of the master chip 400 through a conductive wire. Specifically, the conductive ball 550 is in contact with the protrusion structure of the first bonding pad portion 531 and the recess structure of the second bonding pad portion 533. The protrusion structure of the first bonding pad portion 531 and recess structure of the second bonding pad portion 533 can form a burdening platform and provide additional surface area to fix the conductive ball 550.

Reference is made to FIG. 4. The slave chip 500 includes a first bonding pad 530a and a second bonding pad 530b, and a second bonding pad portion 533a of the first bonding pad 530a contacts a second bonding pad portion 533b of the second bonding pad 530b to form a two-way switch which can selectively form an open circuit or a closed circuit by selectively putting the conductive ball 550 on the first bonding pad 530a or the second bonding pad 530b. In some other embodiments of the present disclosure, the first bonding pad portion 531a of the first bonding pad 530a contacts the first pad portion 531b of the second bonding pad 530b, but the present disclosure is not limited in this respect. The first bonding pad portion 531a of the first bonding pad 530a can contact the second bonding pad portion 533b of the second bonding pad 530b according to some embodiments of the present disclosure.

The slave chip 500 further includes a first transceiver 560 and a second transceiver 570. The first transceiver 560 includes an output terminal 561 and an input terminal 563 in which the output terminal 561 is electrically connected to the first bonding pad portion 531a of the first bonding pad 530a. The second transceiver 570 includes an output terminal 571 and an input terminal 573 which is electrically connected to the second bonding pad portion 533 of the first bonding pad 530a. Therefore, a switch between the first transceiver 560 and the second transceiver 570 is formed. In this embodiment of the present disclosure, the second bonding pad portion 533a of the first bonding pad 530a further contacts the second bonding pad portion 533b of the second bonding pad 530b to form a two-way switch which can selectively form an open circuit or a closed circuit by selectively putting the conductive ball 550 on the bonding pads 530, e.g., the first bonding pad 530a, and the second bonding pad 530b.

Furthermore, slave chip 500 also includes a third bonding pad 530c. When the second bonding pad portion 533a of the first bonding pad 530a contacts the second bonding pad portion 533b of the second bonding pad 530b, the first bonding pad portion 531b of the second bonding pad 530b is electrically connected to the first bonding pad portion 531c or the second bonding pad portion 533c of the third bonding pad 530c to form a two-way switch. When the second bonding pad portion 533a of the first bonding pad 530a contacts the first bonding pad portion 531b of the second bonding pad 530b, the second bonding pad portion 533b of the second bonding pad 530b is electrically connected to the first bonding pad portion 531c or the second bonding pad portion 533c of the third bonding pad 530c to form a two-way switch, but the present disclosure is not limited in this respect. In this case, the aforementioned two-way switch can decide if a closed circuit is formed between the third bonding pad 530c and the first transceiver 560, and the two-way switch is among the first transceiver 560, the second transceiver 570, and the third bonding pad 530c of the slave chip 500.

The slave chip 500 further includes an input bonding pad 530d. A first bonding pad portion 531d or a second bonding pad portion 533d of the input bonding pad 530d is electrically connected to the input terminal 563 of the first transceiver 560. If a conductive material such as the conductive ball 550 is formed between the first bonding pad portion 531d and the second bonding pad portion 533d to contacts thereof, a signal can be transmitted to the first transceiver 560 passing through the input bonding pad 530d.

In an embodiment of the present disclosure, the semiconductor device 300 includes a first slave chip 500a mounted on the master chip 400. As shown in FIG. 4, a metal ball 350a located on the input metal pad simultaneously contacts the first pad portion 431d and the second pad portion 433d, and another metal ball 350b located on the first metal pad 430a simultaneously contacts the first pad portion 431a and the second pad portion 433a to form a closed circuit between the first transceiver 460 and the second transceiver 470. The first transceiver 460 is the substantially the same as the first transceiver 260, and the second transceiver 470 is substantially the same as the second transceiver 270. Therefore, a signal can be transmitted from the input metal pad 430d to the second transceiver 470 passing through the first transceiver 460 and the first metal pad 430a. Moreover, a conductive ball 550a is located on the second bonding pad 530b of the first slave chip 500a to contact the first bonding pad portion 531b and the second bonding pad portion 533b thereof, and the conductive ball 550a is electrically connected to the metal ball 350b on the first metal pad 430a through a conductive wire. Therefore, a signal from the input metal pad 430d of the master chip 400 can be transmitted to the second transceiver 570 of the first slave chip 500a. Specifically, the first bonding pad portion 531a and the second bonding pad portion 533a are electrically disconnected such that an open circuit is formed between the first transceiver 560 and the second transceiver 570 to prevent a signal of the first transceiver 560 from being transmitted to the second transceiver 570. In this case, an electrical circuit between the first transceiver 560 and second transceiver 570 can be adjusted easily and fast such that a better, more robust stack-type semiconductor package which may be assembled more easily and at lower cost can be obtained.

Figure 5:
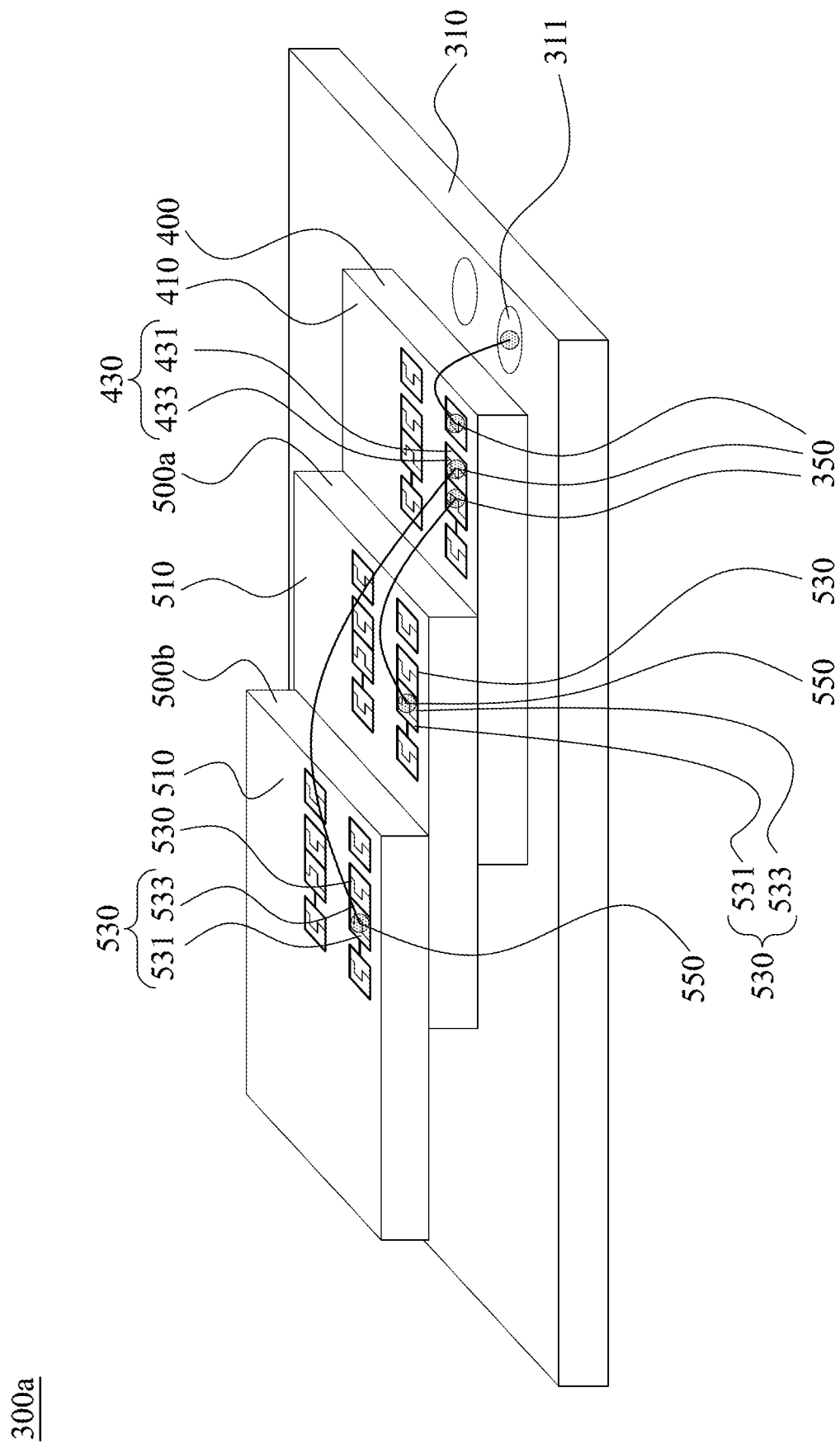
FIG. 5 is a schematic diagram of a semiconductor device according some embodiments in the present disclosure.
Figure 6:
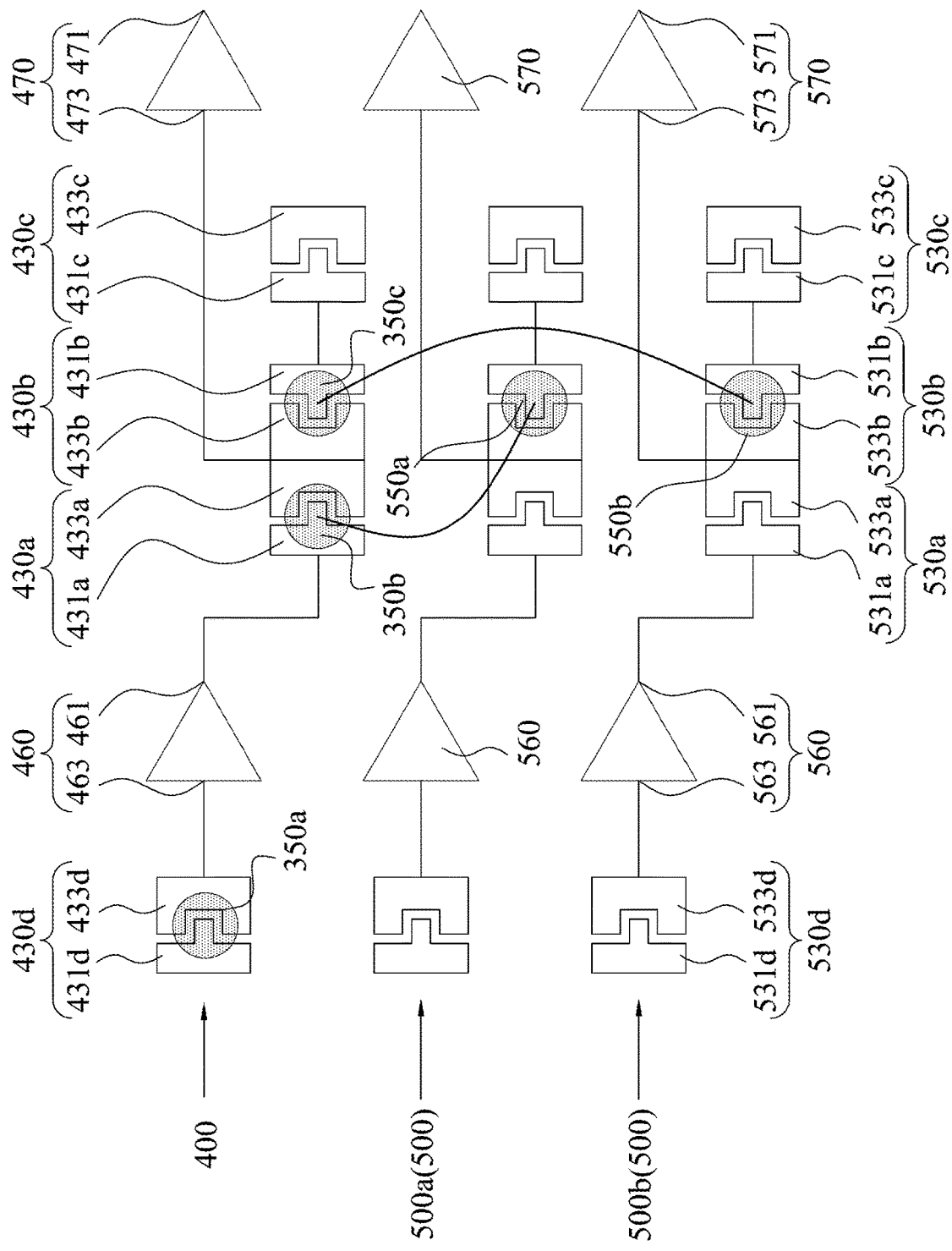
FIG. 6 is a schematic circuit diagram of a chip of the semiconductor device in the FIG. 5.

Reference is made to FIG. 5 and FIG. 6. FIG. 5 is a schematic diagram of a semiconductor device according some embodiments in the present disclosure. FIG. 6 is a schematic circuit diagram of a master chip and two slave chips of the semiconductor device in the FIG. 5, but FIG. 6 does not specifically represent electrical connection relation of the semiconductor device in FIG. 5. FIG. 6 is a schematic circuit diagram of a chip of the semiconductor device in the FIG. 5, but FIG. 6 does not specifically represent electrical connection relation of the semiconductor device in FIG. 5. In some embodiments of the present disclosure, a semiconductor device 300a includes a substrate 310, a master chip 400 mounted on the substrate 310, a first slave chip 500a, and a second slave chip 500b. The first slave chip 500a is stacked on the active surface 410 of the master chip 400. The second slave chip 500b is stacked on a first active surface 510 of the first slave chip 500a. As shown in FIG. 6, three metal balls 350a, 350b, and 350c are respectively located on the first metal pad 430a, the second metal pad 430b, and the input metal pad 430d. Moreover, two conductive balls 550a and 550b are respectively located on the second bonding pad 530b of the first slave chip 500a and the second bonding pad 530b of the second slave chip 500b. A first conductive wire is formed between the metal ball 350b on the first metal pad 430a and the conductive ball 550a on the second bonding pad 530b of the first slave chip 500a. A second conductive wire is formed between the metal ball 350c on the second metal pad 430b and the conductive ball 550b on the second bonding pad 530b of the second slave chip 500b. The second transceiver 570 of the first slave chip 500a and the second transceiver 570 of the second slave chip 500b are electrically connected to the first transceiver 460. Therefore, a signal from the input metal pad 430d can be transmitted to the two second transceiver 570 of the first slave chip 500a and the second slave chip 500b without interference of a signal coming from any first transceiver 560 thereof.

Figure 7:
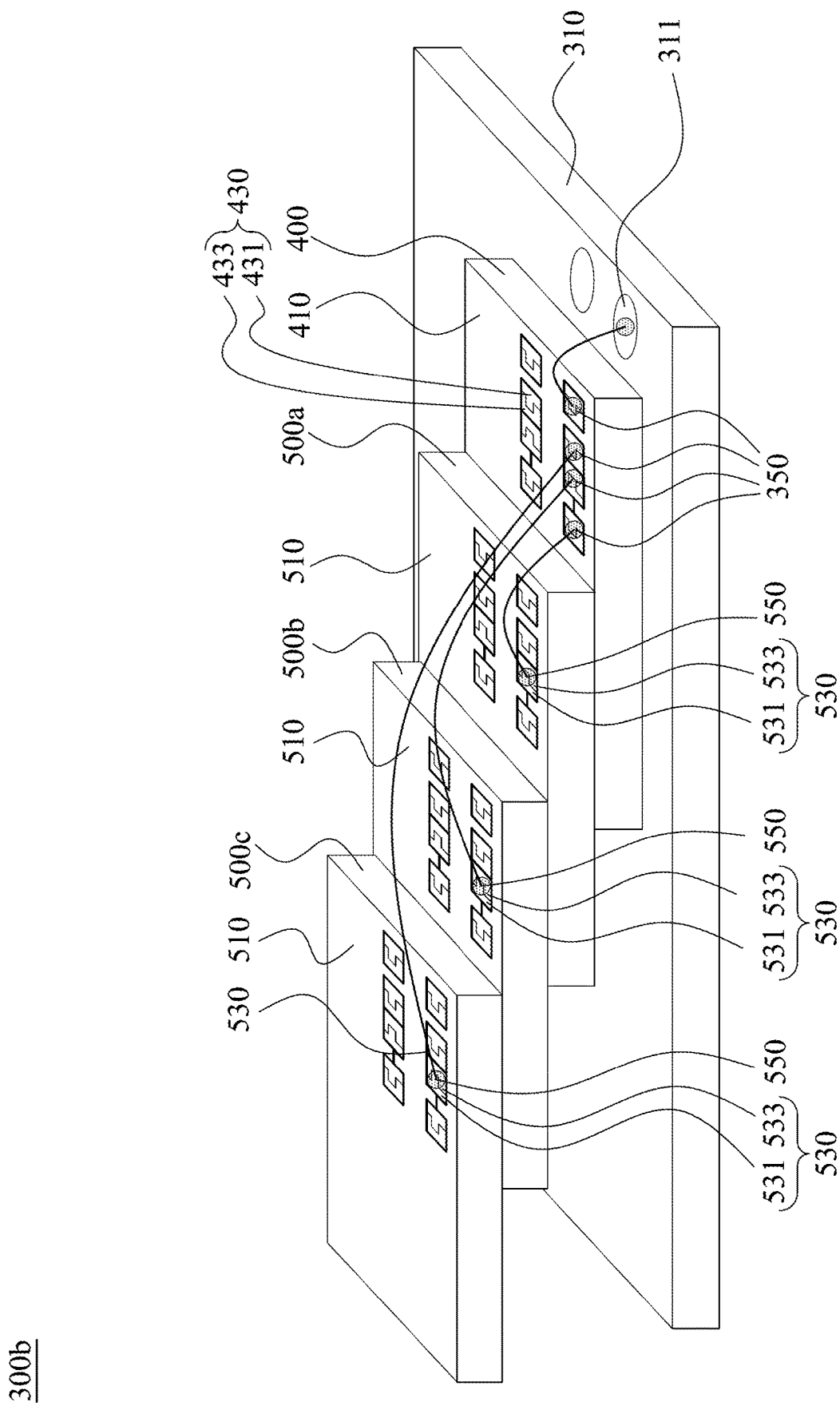
FIG. 7 is a schematic diagram of a semiconductor device according some embodiments in the present disclosure.
Figure 8:
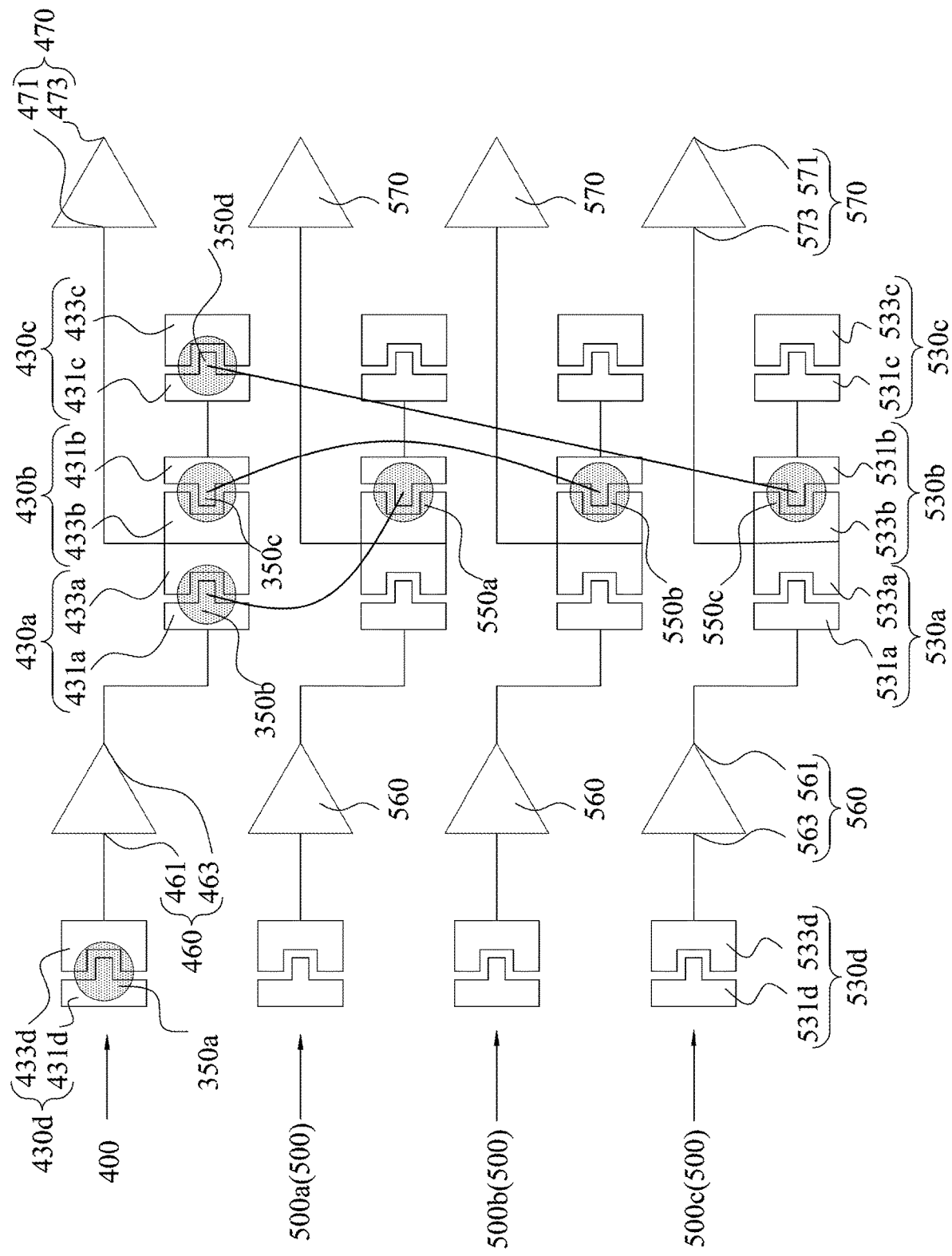
FIG. 8 is a schematic circuit diagram of a chip of the semiconductor device in the FIG. 7.

Reference is made to FIG. 7 and FIG. 8. FIG. 7 is a schematic diagram of a semiconductor device according some embodiments in the present disclosure. FIG. 8 is a schematic circuit diagram of a master chip and three slave chips of the semiconductor device in the FIG. 7, but FIG. 8 does not specifically represent the electrical connection relation of the semiconductor device in FIG. 7. Compared with the semiconductor device 300a, a semiconductor device 300b further includes a third slave chip 500c stacked on the first active surface 510 of the second slave chip 500b. As shown in the FIG. 8, four metal balls 350a, 350b, 350c, and 350d are respectively located on the first metal pad 430a, the second metal pad 430b, the third metal pad 430c, and the input metal pad 430d. Moreover, three conductive balls 550a, 550b, and 550c are respectively located on the second bonding pad 530b of the first slave chip 500a, the second bonding pad 530b of the second slave chip 500b, and the second bonding pad 530b of the third slave chip 500c. A first conductive wire is formed between the metal ball 350b on the first metal pad 430a and the conductive ball 550a on the second bonding pad 530b of the first slave chip 500a. A second conductive wire is formed between the metal ball 350c on the second metal pad 430b and the conductive ball 550b on the second bonding pad 530b of the second slave chip 500b. A third conductive wire is formed between the metal ball 350d on the third metal pad 430c and the conductive ball 550c on the second bonding pad 530b of the third slave chip 500c. The three second transceivers 570 of the first slave chip 500a, the second slave chip 500b, and the third slave chip 500c are electrically connected to the first transceiver 460. Therefore, a signal from the input metal pad 430d can be transmitted to the three second transceivers 570 of the first slave chip 500a, the second slave chip 500b, and the third slave chip 500c without interference of a signal coming from any first transceivers 560 thereof.

In conclusion, metal pads on a chip include a first pad portion and a second pad portion separated to the first pad portion to form an open circuit. A metal ball can be selectively formed on the metal pad to form a closed circuit between the first pad portion and the second pad portion. By the selective formation of the metal ball, the electrical circuit of the chip can be adjusted fast and easily such that the chip can be used in 3D field to decrease cost. Moreover, the first pad portion includes a protrusion structure extends to a recess structure of the second pad portion, thereby providing a burdening platform to fix the metal ball and increasing contacting area between the metal ball and the metal pad.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims.

What is claimed is:

1. A semiconductor device, comprising:
a substrate; and
a chip stacked on the substrate, comprising:
an active surface; and
at least one metal pad disposed on the active surface comprising a first pad portion and a second pad portion separated from the first pad portion to form an open circuit, wherein the first pad portion comprises a protrusion structure and the second pad portion comprises a recess structure, and the protrusion structure of the first pad portion extends toward the recess structure of the second pad portion, wherein the at least one metal pad of the chip comprises a first metal pad and a second metal pad, and the first or second pad portion of the first metal pad contacts the first or second pad portion of the second metal pad.

2. The semiconductor device of claim 1, wherein the recess structure of the second pad portion surrounds the protrusion structure of the corresponding first pad portion.

3. The semiconductor device of claim 1, further comprising at least one metal ball in contact with the first pad portion and the second pad portion to form a closed circuit.

4. The semiconductor device of claim 3, wherein the metal ball is at least in contact with the protrusion structure of the first pad portion and the recess structure of the second pad portion.

5. The semiconductor device of claim 1, wherein the semiconductor device further comprises:
a first transceiver comprising an output terminal electrically connected to the first pad portion of the first metal pad; and
a second transceiver comprising an input terminal electrically connected to the second pad portion of the first metal pad.

6. The semiconductor device of claim 5, wherein the at least one metal pad comprises an input metal pad, and the first pad portion or the second pad portion of the input metal pad is electrically connected to an input terminal of the first transceiver.

7. A semiconductor device, comprising:
a substrate;
a master chip disposed on the substrate, comprising:
an active surface; and
at least one metal pad disposed on the active surface; and
at least one slave chip stacked on the active surface of the master chip, comprising:
a first active surface; and
a plurality of bonding pads disposed on the first active surface, each bonding pad comprising a first bonding pad portion and a second bonding pad portion separated from the first bonding pad portion to form an open circuit, wherein the first bonding pad portion comprises a protrusion structure and the second bonding pad portion comprises a recess structure, and the protrusion structure of the first bonding pad portion extends toward the recess structure of the corresponding second bonding pad portion; and
a conductive ball in contact with the first bonding pad portion and the second bonding pad portion of one of the bonding pads to form a closed circuit, such that the conductive ball is electrically connected to the metal pad of the master chip through a conductive wire.

8. The semiconductor device of claim 7, wherein the recess structure of each second bonding pad portion surrounds the protrusion structure of the corresponding first bonding pad portion.

9. The semiconductor device of claim 7, wherein the conductive ball is in contact with the protrusion structure of the first bonding pad portion and the recess structure of the corresponding second bonding pad portion.

10. The semiconductor device of claim 7, wherein the bonding pads of the slave chip comprises a first bonding pad and a second bonding pad, and the first bonding pad portion of the first bonding pad contacts the first bonding pad portion of the second bonding pad.

11. The semiconductor device of claim 7, wherein the bonding pads of the slave chip comprises a first bonding pad and a second bonding pad, and the second bonding pad portion of the first bonding pad contacts the second bonding pad portion of the second bonding pad.

12. The semiconductor device of claim 7, wherein the bonding pads of the slave chip comprises a first bonding pad and a second bonding pad, and the first bonding pad portion of the first bonding pad contacts the second bonding pad portion of the second bonding pad.

13. The semiconductor device of claim 7, wherein the bonding pads comprise a first bonding pad, and the slave chip further comprises:
- a first transceiver comprising an output terminal electrically connected to the first bonding pad portion of the first bonding pad; and
- a second transceiver comprising an input terminal electrically connected to the second bonding pad portion of the first bonding pad.

14. The semiconductor device of claim 13, wherein the bonding pads comprise a second bonding pad, and the second bonding pad portion of the first bonding pad contacts the first bonding pad portion or the second bonding pad portion of the second bonding pad.

15. The semiconductor device of claim 13, wherein the bonding pads comprise an input bonding pad, and the first bonding pad portion or the second bonding pad portion of the input bonding pad is electrically connected to an input terminal of the first transceiver.

* * * * *